United States Patent [19]

Suzuki et al.

[11] Patent Number: 5,263,002
[45] Date of Patent: Nov. 16, 1993

[54] SEMICONDUCTOR MEMORY DEVICE AND ITS TOPOGRAPHY

[75] Inventors: Youichi Suzuki; Makoto Segawa, both of Yokohama, Japan

[73] Assignee: Kabushiki Kaisha Toshiba, Kawasaki, Japan

[21] Appl. No.: 713,530

[22] Filed: Jun. 12, 1991

[30] Foreign Application Priority Data

Jun. 12, 1990 [JP] Japan .................................. 2-153715

[51] Int. Cl.⁵ .............................................. G11C 5/06
[52] U.S. Cl. .................................. 365/230.03; 365/63
[58] Field of Search ........................... 365/63, 230.03

[56] References Cited

U.S. PATENT DOCUMENTS

| | | | |
|---|---|---|---|
| 4,636,982 | 11/1987 | Takemae et al. | 365/230.03 |
| 4,931,994 | 6/1990 | Matsui et al. | 365/230.03 |
| 5,014,246 | 5/1991 | Komatsu et al. | 365/230.03 |
| 5,150,330 | 9/1992 | Hag | 365/230.03 |

FOREIGN PATENT DOCUMENTS 62-75996  4/1987  Japan .

*Primary Examiner*—Margaret R. Wambach
*Attorney, Agent, or Firm*—Foley & Lardner

[57] ABSTRACT

In the semiconductor memory device, memory cells are divided into plural blocks; each block is further divided into plural I/O unit groups; and furthermore each I/O unit group is divided into plural small groups. The word lines provided for each small group of memory cells arranged at similar locations in each unit group are connected in common to a word line selecting line selected by a select circuit. Therefore, the number of memory cells connected to one word line can be reduced to decrease the power consumption and to increase the operating speed, without increasing the wiring capacitance and the chip size.

5 Claims, 4 Drawing Sheets

SEMICONDUCTOR MEMORY DEVICE AND ITS TOPOGRAPHY

BACKGROUND OF THE INVENTION

The present invention relates to a semiconductor memory device and more specifically to a semiconductor memory device in which a memory cell array is divided into a plurality of blocks.

In a static RAM composed of memory cells arranged in matrix form, where a data is written in or read out of a specific memory cell, a word line is selected by a row decoder and a bit line is selected by a column decoder. In this case, when the word line is selected by the row decoder, transfer gates of all the memory cells connected to the selected word line open. Therefore, in the case where a number of memory cells are connected to a single word line, there exists a problem in that power consumption increases. To reduce the power consumption, the divided word line method has been adopted, in which a word line is divided into several groups to reduce the number of memory cells connected to the single selected word line.

FIG. 4 shows an example of the memory of the above-mentioned method, in which a memory cell array composed of 512 row×512 column memory cells is divided into 16 blocks 1 to 16 in the row direction. Further, each row of each block is composed of 32 cells=(4 cell/IO)×8, where each row is further divided into 8 I/O units each composed of 4 cells. Further, each of 16 decoders D1 to D16 is provided for each divided block, and a sense amplifier SA is arranged on one side end of the cell array to read data stored in the memory cell array.

FIG. 5 shows a more detailed partial configuration of the memory shown in FIG. 4, in which a memory cell array composed of only one row and two blocks is shown by way of example. One input/output (I/O) unit is composed of 4 memory cells 51, and one of sense amplifiers SA111 to SA118 is provided for each I/O unit. One block is composed of 32 memory cells, and the 32 cells are connected to one word line W101 or W102. The decoder DEC 51 or DEC 52 is a NOR gate for selecting a specific row of a block. That is, a row select line G101 for selecting a row and a block select line B101 or B102 for selecting a block are connected to the input terminals of the decoder DEC 51 or 52, and a word line W101 or W102 is connected to the output terminal thereof, respectively. When the first row is selected by the row select line G101 and the first (left side) block is selected by the block select line B101, the word line W101 changes to a high level to open transfer gates of the memory cells 51 in this first selected block. In this prior-art memory, however, since a single sense amplifier SA must be arranged for each I/O unit composed of 4 memory cells, there exists another problem in that the chip size inevitably increases.

To overcome this problem, a memory device in which a single sense amplifier is used in common for a plurality of blocks has been proposed, as shown in FIG. 6. In this memory device, 8 sense amplifiers are provided for two blocks so as to be usable in common for two blocks via 8 data lines D201 to D208. In this memory device, although the number of sense amplifiers can be reduced, the presence of the data lines D201 to D208 increases the wiring capacitance and therefore the data read speed is reduced. In addition, there exists the other problem in that the chip size increases in the column direction, because the number of data lines D201 to D208 increases with increasing number of bits. In summary, the prior-art semiconductor memory device involves problems in that the chip size increases and the data read speed decreases with increasing number of memory cells.

SUMMARY OF THE INVENTION

With the problems in mind, therefore, the object of the present invention is to provide a semiconductor memory device which can reduce the power consumption, increase the operating speed, and decrease the chip size, simultaneously.

According to the present invention, there is provided a semiconductor memory device, comprising: a memory cell array composed of memory cells arranged in matrix fashion and divided into plural blocks, memory cells in each divided block being further divided into plural input/output unit groups and each divided unit group being further divided into plural small groups each composed of the same number of memory cells; a plurality of word lines provided for each small group; a plurality of word line selecting lines each connected in common to word lines each connected to a small group of memory cells arranged at similarly corresponding locations in each divided unit group; and a select circuit for selecting any one of said plural word line selecting lines.

In the semiconductor memory device according to the present invention, memory cells form groups in input/output unit in each block; this formed unit group includes small groups of memory cells arranged at similarly corresponding locations in each unit group; the word lines provided for each small group at the corresponding locations are connected in common to the word line selecting line; and the word line selecting lines are selected by a select circuit. Therefore, it is possible to reduce the number of memory cells connected to one word line and thereby the power consumption. Furthermore, the word lines are selected by selecting the word line selecting line through the select circuit, to change the word lines connected to this word line selecting line to a high voltage level, it is possible to increase the operating speed and decrease the chip size, by reducing the wiring capacitance and wiring resistance.

Furthermore, since the select circuit is arranged on both the sides of the block so that the word line selecting lines can be wired on both the sides thereof, it is possible to reduce the chip dimension in the column direction, as compared with when the select circuit is arranged on the same side of the block in the column direction.

Furthermore, when one sense amplifier is used in common for blocks in order to reduce the number of the sense amplifiers, there exists a tendency to increase the wiring area. In the present invention, however, since the word lines are divided into plural lines in each block so as to be selected by the word line selecting line and the select circuit, and further each block is provided with the sense amplifier for a constant number of memory cells, the wiring area can be reduced; the operating speed can be increased; and the chip size can be decreased.

DESCRIPTION OF THE PREFERRED EMBODIMENTS

Figure 1:
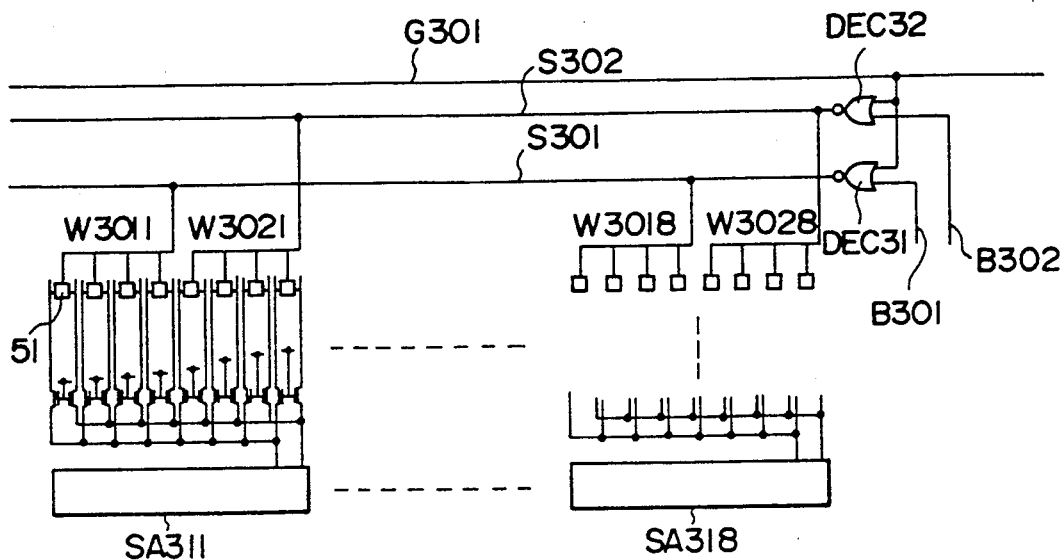
FIG. 1 is a block diagram showing the configuration of a first embodiment of the semiconductor memory according to the present invention.
Figure 4:
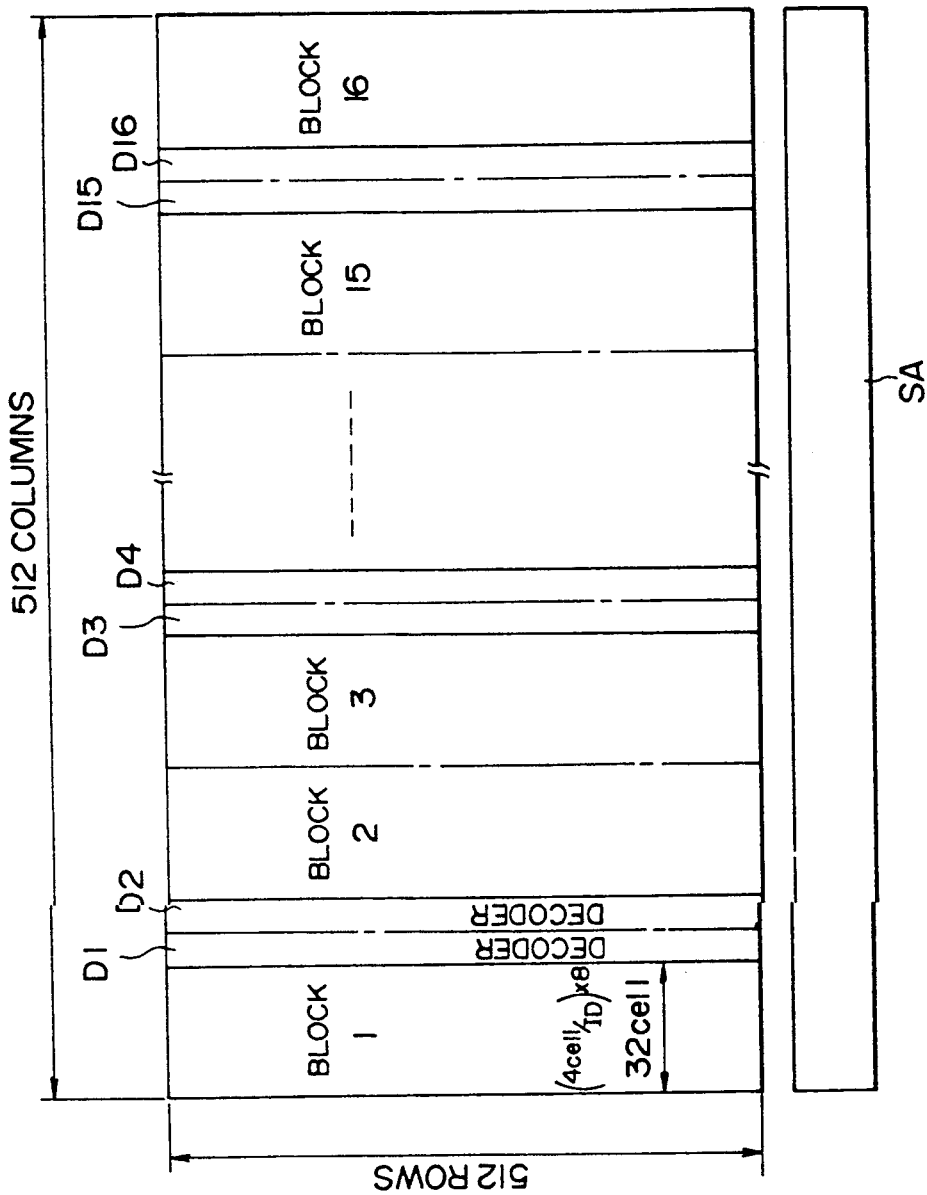
FIG. 4 is a diagram for assistance in explaining the divided blocks in a prior-art semiconductor memory.

Embodiments of the present invention will be described hereinbelow with reference to the attached drawings. FIG. 1 shows the one row configuration of the first embodiment of the semiconductor memory. In the same way as the prior-art memory shown in FIG. 4, memory cells are arranged in 512 rows and 512 columns, and divided into 8 blocks so that one block includes 64 cells. Being different from the prior-art memory, the word line in one block is divided into 16 word lines W3011 to W3018 and W3021 to W3028. Each word line is connected to 4 memory cells, and each of 8 sense amplifiers SA311 to SA318 is provided for 8 memory cells which constitutes one input/output I/O unit. These word lines W3011 to W3018 are connected to a word line selecting line S301, and these word lines W3021 to W3028 are connected to another word line selecting line S302. These two word line selecting lines S301 and S302 can be selected by two decoders DEC 1 and DEC 32, respectively. A row line G301 for selecting a row and a block select line B301 for selecting a half of this block are connected to two input terminals of the decoder DEC 31, and the word line selecting line S301 is connected to an output terminal thereof. In the same way, a row line G301 and a block select line B302 are connected to two input terminals of the decoder DEC 32 and a word line selecting line S302 is connected to an output terminal thereof.

When the row line G301 is selected and further the block select line B301 is selected, the decoder DEC 31 selects the word line selecting line S301, so that the word lines W3011 to W3018 are selected to open transfer gates of the memory cells connected to these word lines.

As described above, since the memory cell array is divided into 8 blocks; the word lines are divided into plural groups in each block; and the sense amplifier is arranged for each input/output I/O unit, it is possible to reduce the number of memory cells connected to the selected word line. Therefore, the power consumption can be reduced and the operating speed can be increased, without increasing the wiring capacity of the data lines and the chip size.

Figure 5:
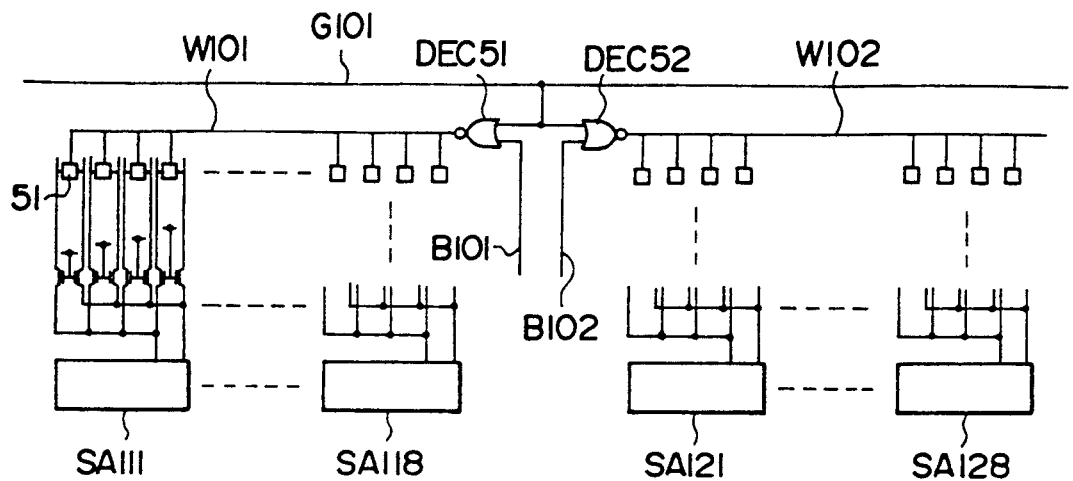
FIG. 5 is a block diagram showing one row configuration of the prior-art semiconductor memory shown in FIG. 5.
Figure 6:
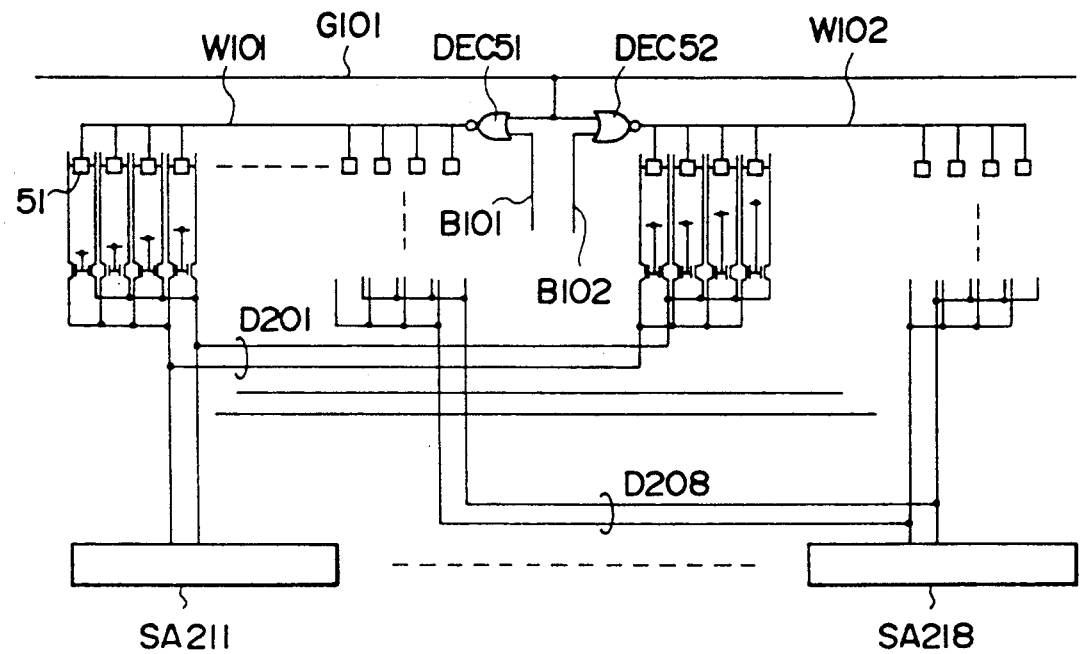
FIG. 6 is a block diagram showing one row configuration of another prior-art semiconductor memory.

In comparison between the first embodiment shown in FIG. 1 and the prior-art memory shown in FIG. 6, in the prior-art memory 32 memory cells are connected to the one word line W101, and similarly in the embodiment 32 memory cells are connected to the word line selecting line S301 connected to the word lines W3011 to W3018. Therefore, the two are equivalent to each other from the standpoint of power consumption. Further, since 8 memory cells are connected to each sense amplifiers in both the prior-art memory shown in FIG. 6 and the embodiment shown in FIG. 1, the number of sense amplifiers can be reduced as compared with the prior-art memory device shown in FIG. 5.

In the prior-art memory device shown in FIG. 6, the data lines D201 to D208 are required to use the sense amplifiers SA211 and SA218 in common. In the embodiment shown in FIG. 1, however, no such data lines as shown in FIG. 6 are required. Instead, although the word line selecting lines S301 and S302 are necessary in the embodiment shown in FIG. 1, the wiring area required for these two lines S301 and S302 is sufficiently small, thus it being possible to reduce the chip size. As described above, in the first embodiment, it is possible to attain a lower power consumption, higher operating speed, and smaller chip size, simultaneously.

Figure 2:
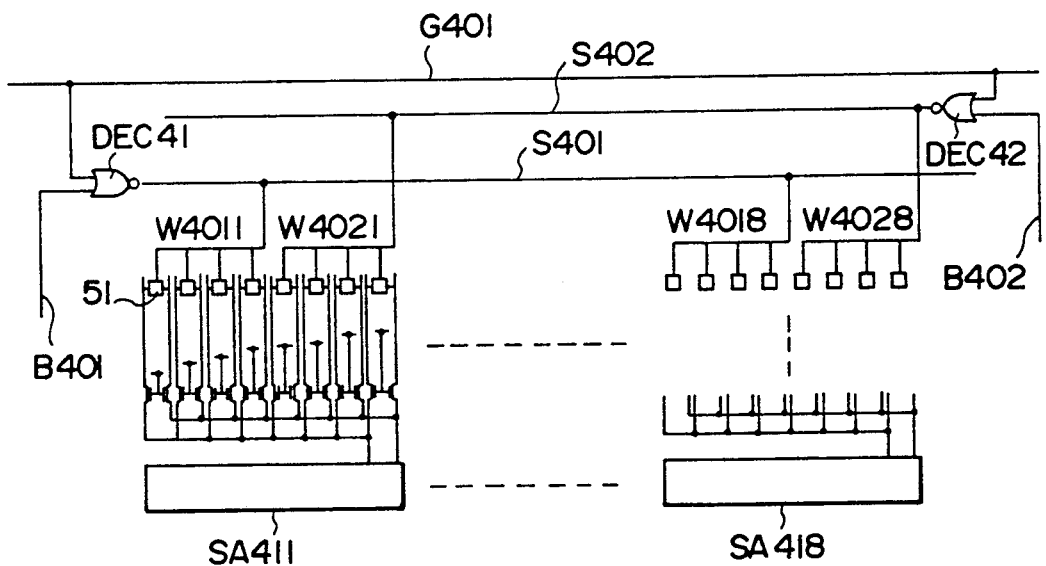
FIG. 2 is a block diagram showing the configuration of a second embodiment of the semiconductor memory according to the present invention.

FIG. 2 shows a second embodiment of the present invention, in which the decoders DEC 41 and DEC 42 are arranged on both sides of the block, respectively, being different from the first embodiment shown in FIG. 1. Owing to this arrangement, the block select lines B401 and B402 connected to the input terminals of the two decoders DEC 41 and DEC 42, respectively can be wired from both the side of the block. That is, since the two decoders DEC 41 and DEC 42 are not arranged in the column direction, it is possible to reduce the chip dimension in the column direction. In addition, it is possible to facilitate wiring of the two decoders DEC 41 and DEC 42 through the word line selecting lines S401 and S402. Therefore, a number of memory cells can be easily arranged at the middle of each block, and further it is possible to realize a lower power consumption, higher operating speed, and higher production yield, without increasing the chip size.

Figure 3:
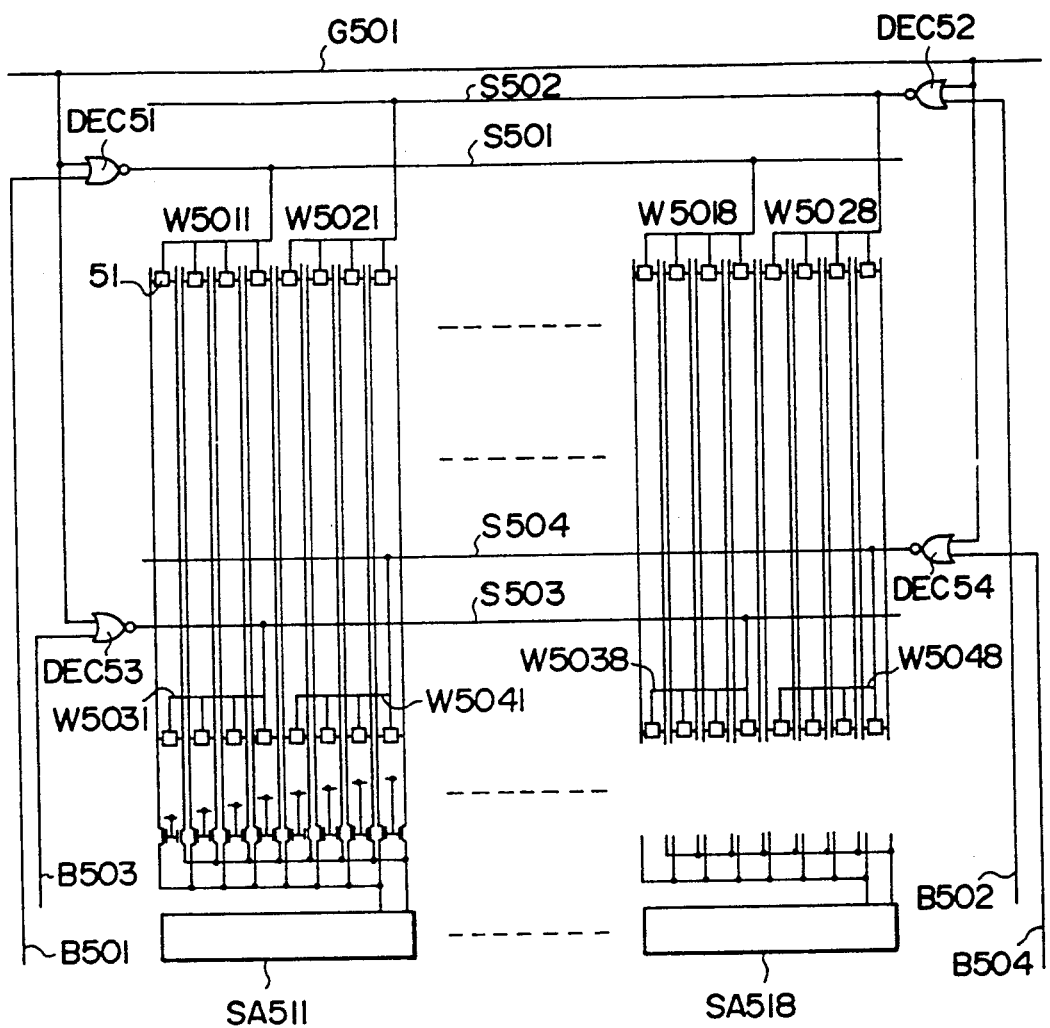
FIG. 3 is a block diagram showing the configuration of a third embodiment of the semiconductor memory according to the present invention.

FIG. 3 shows a third embodiment of the present invention, in which the configuration is the same as the second embodiment shown in FIG. 2, except that a single row select line G501 is provided for every two rows. In the upper stage row, word lines W5011 to W5018 and W5021 to W5028 are provided for every four memory cells, respectively. The word lines W5011 to W5018 are connected to the word line selecting line S501, and the word lines W5021 to W5028 are connected to the word line selecting line S501. In the lower stage row, word lines W5031 to W5038 and W5041 to W5048 are provided for every four memory cells, respectively. The word lines W5031 to W5038 are connected to the word line selecting line S503 and the word lines W5041 to W5048 are connected to the word line selecting line S504.

The word line selecting line S501 is selected by a decoder DEC 51 having two input terminals connected to a row select line G501 and a block select line B501. The word line selecting line S502 is selected by a decoder DEC 52 having two input terminals connected to the row select line G501 and a block select line B502. In the same way, the lower stage word line selecting line S503 is selected by a decoder DEC 53 and the lower stage word line selecting line S504 is selected by a decoder DEC 54. Further, each of sense amplifiers SA511 to SA518 is provided for each of the upper and lower stage input/output I/O units, that is, for every 8 memory cells. In this embodiment, it is possible to wire the bit lines on the first layer and the row select lines G501 and the word line selecting lines S501 to S504 on the second layer.

In this second embodiment, since the row select line G501 is used in common for two rows, it is possible to reduce the number of row select lines connected to the decoders DEC 51 to 54. Further, in the same way as in the second embodiment, since the decoders DEC 51 to 54 are arranged on both the sides of the block, even if the size of the memory cell is reduced and therefore the wiring pitch is reduced to such an extent that the decoders are difficult to be arranged or if the number of word lines is increased in each block, it is possible to reduce the chip dimension in the column direction.

The above embodiments have been described by way of example. Without being limited thereto, therefore, it is possible to freely determine the number of blocks into which the memory cells are divided, the number of word lines in the clock, etc. Further, in the above embodiments, the decoders of NOR gates are used as the select circuits. However, any other circuits for selecting the word line selecting line is of course usable.

As described above, in the semiconductor memory device according to the present invention, since the memory cell array is divided into plural blocks and further the word line in the block is divided into plural groups, the number of memory cells connected to a single selected word line decreases, so that the power consumption can be reduced. Further, since the word line can be selected and activated by selecting a word line selecting line through the select circuit, the wiring capacitance and resistance can be reduced, thus achieving a higher operating speed and a smaller chip size.

We claim:

1. A semiconductor memory device, comprising:
   a memory cell array composed of memory cells arranged in matrix fashion and divided into a plurality of blocks, memory cells in each of said divided blocks being further divided into a plurality of input/output unit groups and each of said divided units groups being further divided into a plurality of small groups each composed of the same number of memory cells;
   a plurality of word lines provided for each of said small groups;
   a plurality of word line selecting lines connected in common to word lines connected to a small group of memory cells arranged at similarly corresponding locations in each of said divided unit groups; and
   a select circuit for selecting any one of said plurality of word line selecting lines;
   and wherein said select circuit is separately provided on both side portions of each of said blocks so as to be connected to the word line selecting lines extending from both side portions of each of the blocks.

2. The semiconductor memory device according to claim 1, wherein a sense amplifier is provided for each of said divided unit groups.

3. The semiconductor memory device according to claim 1 wherein said word line selecting lines belonging to a common single row are connected to a row select line via said select circuit.

4. The semiconductor memory device according to claim 1, wherein said word line selecting lines belonging to a plurality of rows are connected to a row select line via said select circuit.

5. The semiconductor memory device according to claim 1, wherein memory cells connected to said word line selecting lines connected to the same row select line so as to form one input/output unit group in different rows are connected to a common amplifier.

* * * * *